United States Patent [19]

Stonestreet et al.

[11] Patent Number: 4,550,411
[45] Date of Patent: Oct. 29, 1985

[54] SOURCES USED IN MOLECULAR BEAM EPITAXY

[75] Inventors: Paul R. Stonestreet, Buxted; David Williams, Tunbridge Wells; Kenneth Anderson, Buxted; Peter J. L. Butcher, Lingfield, all of England

[73] Assignee: VG Instruments Group Limited, England

[21] Appl. No.: 502,628

[22] Filed: Jun. 9, 1983

[30] Foreign Application Priority Data

Mar. 30, 1983 [GB] United Kingdom ............... 8308786

[51] Int. Cl.$^4$ .................................................. H05B 3/02
[52] U.S. Cl. .................................... 373/134; 373/119; 373/128
[58] Field of Search .............. 373/119, 111, 128, 134; 219/121 EF, 121 EE, 121 EQ

[56] References Cited

U.S. PATENT DOCUMENTS 2,896,004 7/1959 Duffy et al. ...................... 373/134
3,108,171 10/1963 Vary ................................ 373/134 X
3,726,984 11/1970 Barbier et al. ................... 373/128

FOREIGN PATENT DOCUMENTS 1270550 4/1972 United Kingdom .
1336910 11/1973 United Kingdom .
1515517 6/1974 United Kingdom .
1381809 1/1975 United Kingdom .
1469978 4/1977 United Kingdom .
2012818A 8/1979 United Kingdom .

Primary Examiner—A. D. Pellinen
Assistant Examiner—Gregory D. Thompson
Attorney, Agent, or Firm—Bacon & Thomas

[57] ABSTRACT

A molecular or atomic beam source for use in molecular beam epitaxy comprises a hollow cylindrical crucible, preferably made of boron nitride, which is heated by an electric current passed through a plurality of very thin elongate metal strips disposed outside of and spaced apart from said crucible and mounted parallel to its axis. In order to maintain the strips in the correct position irrespective of temperature, they may be mounted on springs at each end, but preferably they are made in self supporting pairs linked at the open end of the crucible and mounted on brackets at the other end. The thin strips can be made self supporting by folding along lines parallel to their long axis in a variety of ways. They are arranged to present a large surface area to the crucible which ensures efficient heating and increases the maximum operating temperature of the source. The links between strips at the open end of the crucible can be made from the same material as the strips so that they provide additional heat at the open end of the crucible. This allows the crucible to be operated at higher temperatures than conventional sources and permits higher intensity molecular beams to be produced with true Knusden type evaporation. Therefore the source can also be used to produce beams from high melting point materials such as iron and silicon, as well as more usual materials such as galium, arsenic and phosphorus.

12 Claims, 9 Drawing Figures

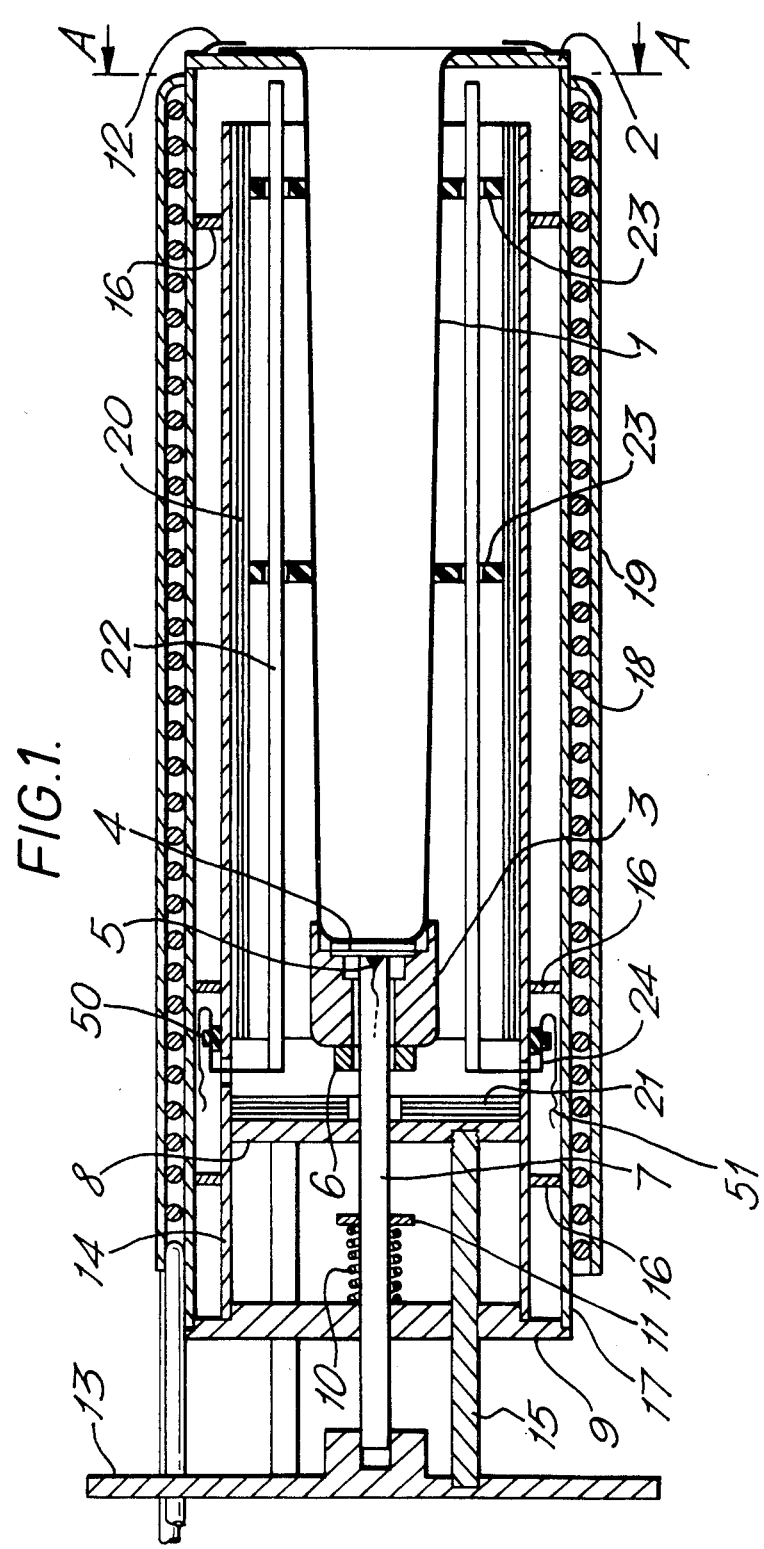

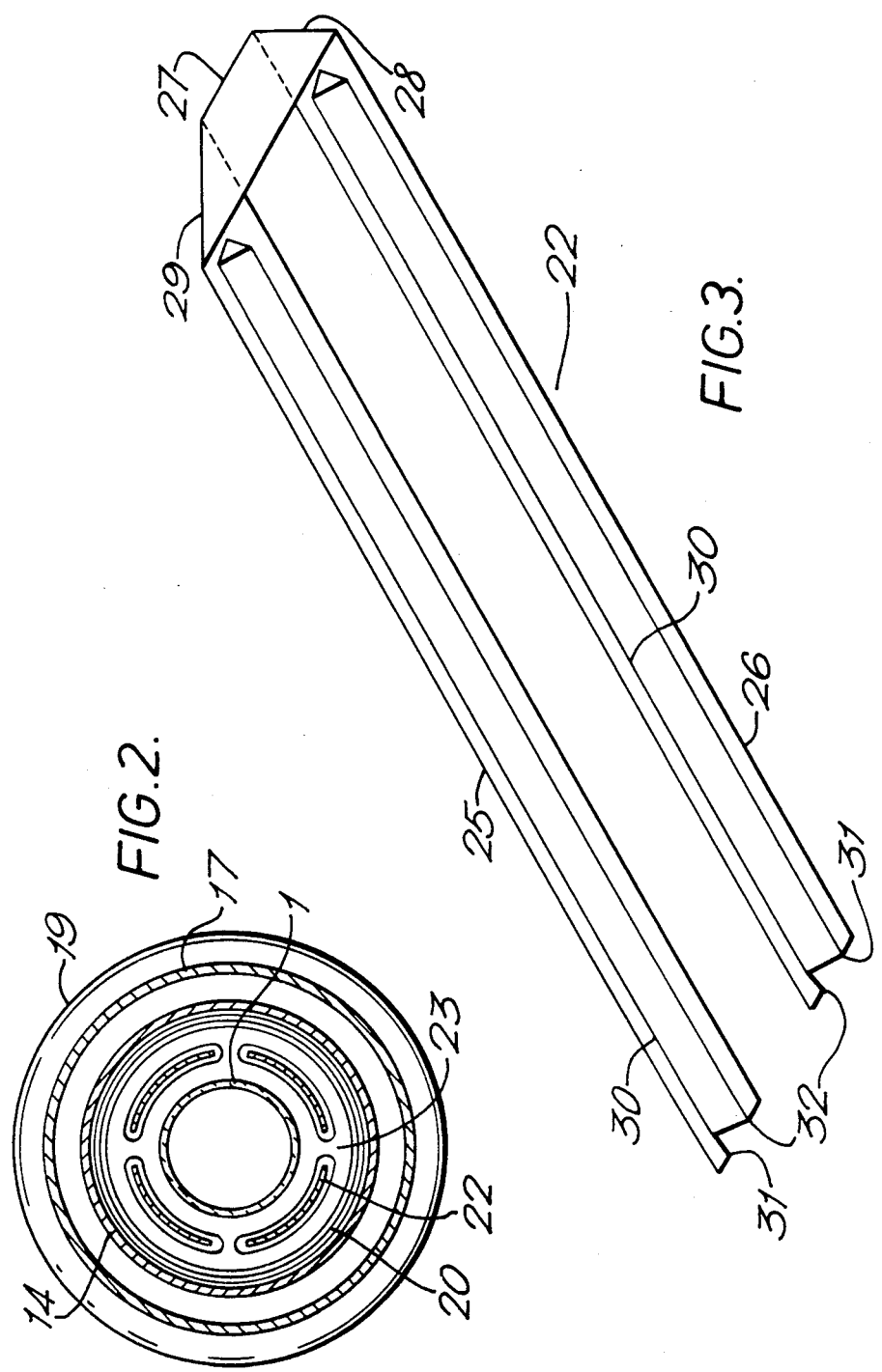

SOURCES USED IN MOLECULAR BEAM EPITAXY

TECHNICAL FIELD

This invention relates to the production of thin crystalline films of certain materials on a substrate of a different material by molecular beam epitaxy, and in particular to sources of molecular or atomic beams known as Knusden cells.

BACKGROUND ART

Molecular beam epitaxy is an important aspect of the manufacture of semiconductor electronic devices such as integrated circuits and transistors for use at U.H.F. and microwave frequencies. The composition, thickness, and uniformity of the deposited layers largely determines the performance of devices manufactured in this way, and it is consequently important to be able to control these parameters accurately during the deposition process, both for production and research purposes. Several techniques for depositing thin films are known, but that known as Molecular Beam Epitaxy is one of the most precise and versatile. It involves the growth of epitaxial (single crystal) films from directed thermal energy molecular or atomic beams on a crystalline substrate in ultra high vacuum (less than $10^{-9}$ torr). An important feature of the process is clearly the production of atomic or mclecular beams of the substances to be deposited, and this invention is concerned with the type of source known as a Knusden Cell. In their simplest form these consist of a crucible of 10–40 ccs. capacity enclosed in a small oven, into which a sample of the required material is placed so that it can be inserted into the vacuum system and vaporized in a controlled way to produce the atomic or molecular beam. The mouth of the crucible is often restricted by an orifice which has a diameter less than the mean free path of the molecules at the pressure in the vacuum system. This results in the production of an atomic or molecular beam in which the direction of motion of the molecules is collimated in one direction, and in which the number of intermolecular or interatomic collisions is minimized. Knusden cell sources are conventionally used for the production of atomic or molecular beams of arsenic, gallium, phosphorus, antimony, indium, manganese, germanium, tin, zinc sulphide, lead telluride, and other similar materials.

A conventional Knusden cell consists of a crucible into which a solid sample of the material is introduced, and a heater capable of raising the temperature of the crucible to between 350° C. and 1400° C., dependent on the material to be vaporised. A remotely controlled shutter of a refractory metal such as tantalum is often fitted over the mouth of the crucible to prevent the escape of the molecular beam when it is not required. The entire cell is mounted in an ultra high vacuum apparatus, and has to be constructed with this in mind. The materials used must be such that even at 1400° C. they do not produce significant amounts of vapour either from the decomposition of the cell materials themselves, or from the expulsion of other materials such as water absorbed into the cell before it was fitted into the vacuum system. Any such contamination emitted from the cell when it is heated will be detrimental to the purity of the thin film deposited from the cell, as well as reducing the vacuum that can be attained in the apparatus. Great care is therefore necessary in the design and construction of these cells to minimize the amount of contamination which reaches the substrate on which the layer is being deposited. Generally, the crucible is made from pyrolytic boron nitride (typically 99.999% pure) or from spectroscopically pure graphite, and the heating elements from pure tantalum wire which is helically wound round the crucible. Several heat shields made from tantalum foil may be wound over the heater, and the entire cell is often surrounded by a cooling shroud which prevents heat escaping from the cell and heating other parts of the vacuum system, as well as condensing any contaminating material vaporised from the crucible walls or the heater. A restricting orifice may also be fitted to the mouth of the crucible as described above. Knusden cells constructed in this way are known, and are briefly described in UK patent application No. 2,012,818 A and UK patent No. 1,469,978.

An alternative form of construction is to employ a heater consisting of tantalum wires running parallel to the axis of the crucible. These wires are conventionally enclosed in alumina tubes to support them when they are heated. Cells constructed in this way are more suited to use at lower temperatures, for the reasons described below. Both these forms of construction suffer from important disadvantages because the area of contact between the wire and the crucible is low, and the heat transfer from the wire to the crucible is inefficient. This requires the temperature of the heating wire to be considerably higher than the required temperature of the crucible, which increases the contamination emitted from the heater and its supports, and limits the maximum temperature to which the crucible can be heated without premature failure of the heater. The large proportion of waste heat radiated from a cell of this kind also increases the demands on the cooling system for the cell shroud. If the heating wire is spaced away from the cell wall, as for example in the alternative form of construction, the efficiency of the heat transfer falls still further, and the problems of supporting the heating element are increased. In the example given above, alumina tubes are employed. However, the heating wire will be in contact with these tubes, and because its temperature has to be considerably higher than that of the crucible, the contamination emitted from the cell will be correspondingly increased. For this reason, cells constructed in this way are more suited to use at lower temperatures. The use of pyrolytic boron nitride tubes to enclose the heating elements would reduce the amount of contamination, but it is a very expensive material, and the cost of the cell would be greatly increased. A further disadvantage is that a heater formed in this way usually contains a number of sharp bends in the wire, which are likely to result in its premature failure. Replacement of the wire is also difficult. The use of a helically wound element on the crucible does not eliminate the requirement for support insulators in contact with the wire because the expansion of the wire when it is heated would result in it becoming slack on the crucible and moving out of position unless additional supports are provided. These increase the amount of contamination, as discussed above. The use of a helically wound element also introduces another disadvantage, namely the existence of a cyclic temperature gradient along the axis of the crucible with the points of maximum temperature at the points where the wire element is in contact with the crucible wall. This is emphasised by the relatively poor thermal conductivity of pyrolytic boron nitride.

However, the most serious defect affecting both types of cell is the fall in temperature at the mouth of the crucible due to the greater heat loss by radiation from the end of the crucible which cannot be enclosed by the heating element. This problem is increased when the mouth is restricted to produce true Knusden evaporation. The effective evaporation temperature of the cell is clearly the lowest temperature in it, because material evaporated at higher temperatures will condense at this point. The fall in temperature at the mouth means that the bulk of the crucible must be heated to a still higher temperature than that needed to evaporate the contents to avoid condensation in the mouth, and to maintain the desired flux of atoms or molecules. This defect further limits the effective maximum temperature of the cell. In some cases it becomes so severe that it is necessary to remove the restriction in the mouth of the cell in order to achieve adequate deposition rates. A wide-mouthed cell of this type does not behave as a true Knusden cell, and the atomic or molecular beams produced are not as well collimated, resulting in a greater spread of the beam and a consequent reduction in the deposition rate on the substrate and a corresponding increase in the contamination of the rest of the vacuum system. However, up to now it has been necessary to tolerate these defects in order to produce a molecular beam at the desired temperature, and many sources for molecular beam epitaxy are designed without the narrow orifice because of the difficulty of heating the end plate which would contain it. Some improvement can be made in the case of a helically wound heater by decreasing the pitch of the turns at the mouth of the crucible, which increases the heat input at this point and reduces the fall in temperature. However, this necessarily means that the pitch of the turns round the remainder of the crucible is greater, and this again limits the maximum temperature as well as worsening the temperature gradient between the turns inherent with a helical heater. In practice, a combination of these problems limits the maximum working temperature of conventional cells to about 1300° to 1400° C., which means that they cannot be used to produce beams of silicon or iron, and are not particularly satisfactory with germanium. If a source operating with true Knusden evaporation is used. its maximum effective temperature may well be lower than 1300° C.

It is an object of the present invention, therefore, to provide a Knusden cell for molecular beam epitaxy in which these difficulties are overcome, which results in deposited layers of greater purity and uniformity, and which can be used at higher temperatures than conventional cells so that, for example, beams of silicon and iron can be produced without the need for expensive processes like electron beam heating. It is a further object to provide a cell in which the crucible can easily be changed in case of damage, or substituted for one of a different volume, without substantial changes to the rest of the cell, and one in which the heating elements are robust and easily changed in case of failure. It is also an object of the present invention to provide a heating element for a Knusden cell which can produce a higher heat input to a particular part or parts of the crucible than to the remainder, so that the temperature gradient along the cell can be adjusted, usually to minimise it, therefore allowing the construction of a cell capable of true Knusden evaporation at higher temperatures than previously possible.

SUMMARY OF THE INVENTION

Thus, according to the invention there is provided a molecular or atomic beam source for molecular beam epitaxy which comprises a hollow crucible open at one end, said crucible being capable of being heated by an electric current passed through a plurality of thin elongate metal strips disposed outside of and spaced apart from said crucible, said strips being arranged substantially parallel to the axis of said crucible, and to present a major surface area to the crucible wall, and said strips being mounted in such a way as to maintain their position relative to the crucible wall irrespective of the operating temperature and to subtantially eliminate contact of said strips with said crucible wall or any supporting means other than at or near the end or ends of the said strips. In this way the efficiency of heating of the crucible is improved and its maximum operating temperature increased whilst simultaneously the unwanted heating of other parts of the cell which might otherwise cause contamination of the molecular beam produced is minimized. To produce Knusden evaporation the crucible may be provided at its open end with a narrow orifice. As discussed in detail below, the strips may be made substantially self supporting and mounted only at one end, or they may be mounted from both ends with suitable means provided for maintaining the tension in the strips when they are heated.

Thus the source of the invention may be provided with one or more heating elements, each comprising a plurality of said strips which are each supported at one end on insulated electrically conductive supporting means and are electrically connected together at the other end by a conductive link or links in such a way as to permit the current to be passed through all said strips comprising each one of said elements via supply leads connected only at said electrically conductive supporting means, said supporting means preferably being mounted in such a way as to minimize the contact of the said element with any other part of the source construction, and said strips being formed in such a way as to be substantially self-supporting when mounted on said supporting means. In this way the efficiency of heating of the crucible is improved and its operating temperature is increased whilst simultaneously the unwanted heating of other parts of the cell which might otherwise produce contamination of the molecular beam produced is minimized. Preferably each of said elements comprises a pair of elongate metal strips extending parallel to the axis of the crucible, attached to electrically conductive supporting means, eg mounting brackets, at one end and electrically connected together at the other end by a conductive link. The mounting brackets are attached to supporting insulators, and the electrical supply is connected to the brackets. Preferably also the metal strips are made from a refractory metal such as tantalum. It is necessary to keep the current through the elements to a minimum to reduce problems such as unwanted heating of the supply leads and electrical feedthroughs which would occur at high current, so that the cross sectional area of the strips must be reduced to a minimum. The strips ought, however, to present the maximum possible surface area to the crucible to ensure efficient heating, and consequently they must be very thin. It has therefore been considered impractical to use strips which are sufficiently thick as to be self supporting when mounted from one end as envisaged in the invention, because the current required to heat them would be unacceptably high.

Therefore the invention further consists of a heating element for use in a molecular or atomic beam source constructed from at least one elongate strip of a refractory metal having a width much greater than its thickness, said elongate strip being folded along one or more lines parallel to its longest edge whereby the resistance of the strip to bending is increased. Preferably, if more than one fold is provided, subsequent adjacent folds are made in opposite directions so that a corrugated strip of overall width greater than its overall thickness is produced. However, it is also within the scope of the invention to fabricate a thin walled hollow tube of rectangular, circular, or elliptical section from a thin strip in order to produce a self supporting element.

By the use of an essentially flat metallic strip in place of the conventional heater wire, the surface area of the heating element radiating the crucible is greatly increased, and the efficiency of heat transfer to the crucible is improved. The strips, although thin, are very robust and easily handled, especially when folded in the way described. The greater efficiency of radiation raises the maximum operating temperature of the crucible, typically to 1800° C., which allows the cell to be used with iron and silicon, as well as greatly increasing the maximum deposition rates of metals such as aluminium and gallium. The increased uniformity of radiation of the crucible also reduces the temperature gradients along its axis which are sometimes formed when spirally wound heaters are used. The use of heating elements which are substantially self supporting minimizes the area of contact between the elements themselves and their supports, preventing excessive heating of the supports and the consequent emission of contamination, as well as facilitating replacement of the elements. The reduced heating of the supporting insulators is of particular importance because a source constructed according to the invention can be used at higher temperatures than a conventional source. Further, the use of substantially self supporting elements which are mounted only at one end overcomes the problem of mounting the elements in a way which allows for their considerable increase in length when heated without the need for additional supporting insulators in contact with the element. It may however still be necessary to provide some additional restraining means, particularly at the end of the element remote from the supports, to ensure that the element cannot touch the crucible wall or the cooled surround. A slot cut in a suitable insulator such as pyrolytic boron nitride, is usually sufficient. When a corrugated or folded element is used, the area of contact between the element and the sides of such a slot will be very small, and the insulator will not be excessively heated.

The folding of the elements should be done so that adequate rigidity is obtained whilst the maximum possible surface area is presented to the crucible wall. Dependent on the dimensions of the element material and its length, one fold in the centre of the strip at approximately 90° may be sufficient, and if the strip is positioned with the fold away from the crucible and its surfaces inclined at 45° to a tangent at the crucible surface, efficient radiation will be obtained.

When greater rigidity is required, additional folds can be made as explained, preferably in opposite directions to the centre fold, and symmetrically placed about it. This results in a corrugated element which can be positioned as though it were a thick strip to ensure maximum radiation of the crucible. A less preferred method is to form the strip into a thin walled tube or box section, held together, for example, by spot welding. However, this method does not radiate the crucible as efficiently as the previous one, especially if a circular cross section is used, although it does result in an element of great strength. In all cases, the support brackets should preferably be fabricated with the same shape in cross section as the folded element, and good electrical connection can then be assured by clamping the element strip between two rigid shaped brackets and either spot welding or bolting the assembly together. The shaped brackets also help to maintain the correct shape of the folded elements.

In general, the elements, each comprising a number of elongate strips (usually two) should be substantially symmetrically disposed around the crucible, and the spacing between the strips arranged to be approximately equal. A sufficient number of strips should be used to ensure that the gap between adjacent strips is not so large that the uniformity of heating is reduced. The number used will be dependent on the overall width of each strip and the diameter of the crucible. Typically four elements each comprising two strips about 10 mm wide are sufficient for a crucible about 25 mm diameter. It will be appreciated that each element need not be limited to two strips: for example, four strips may be connected at their unsupported ends by a single conductive link, and at the supporting brackets two of the strips may be connected together and to one of the electrical supply leads, and the remaining two connected together and to the other supply lead. However, this arrangement results in different currents flowing in different parts of the conductive link at the unsupported end of the strips, and in general elements constructed from only two strips are preferred.

Although the use of folded elements mounted from only one end is preferred, there nevertheless exists the possibility of mounting the strips from one or both ends on spring loaded mountings of relatively low thermal conductivity. Thus in the beam source of the invention the said strips may be supported by spring means arranged to maintain a suitable tension in the strips irrespective of temperature, and said spring means being provided with electrically insulating mountings on a support arranged in such a way as to ensure that said strips contact only said spring means and such electrically conductive supporting means as may be provided, and said spring means being of thermal conductivity sufficiently low as to prevent excessive heating of the said insulating mountings, thereby improving the efficiency of heating the crucible and simultaneously minimizing the heating of other parts of the cell which might otherwise produce contamination of the molecular beam produced. This method is less preferred than the previous one because when the heating strips are operated at very high temperatures, they tend to become permanently stretched by the spring tension, which results in their premature failure. However, it is useful for cells used at lower temperatures because it provides more even and efficient heating with less contamination than can be obtained with conventional cells.

In the arrangements previously described the conductive links joining the elongate strips which constitute each element may also form part of that element and contribute to the heat emitted from it, so that the heat input to the crucible in the region of the conductive strips can be increased above that obtainable with the strips alone due to the greater area of heated element in that region. This feature of the invention is especially useful if the links are positioned at the ends of the strips close to the open end of the crucible. In this case the greater heat output from the element in the region of the links can be used to compensate for the greater heat losses from the open end of the crucible, consequently overcoming the limitations of conventional sources described earlier. The links are preferably made from the same material as the rest of the element, and are preferably formed integrally with the strip, but, if a different degree of heating is required in the link region, they may be made from a different material, and/or with a different crosssectional area. However, when the links are made from the same material as the element, it is possible to make an element assembly consisting of two folded strips by simply taking a long piece of the corrugated strip, flattening out the corrugations at the point where the link is to join the ends of the individual strips, and twice folding the strip across its wide surface at lines at approximately 45° to its long axis to form a U shaped element with a link section at 90° to two parallel strips. Alternatively, the link section can be made from a separate piece of element material clamped or spot welded to the ends of the strips. This aspect of the invention can also be applied to the alternative embodiment which involves the mounting of individual strips on spring loaded brackets by simply welding or clamping the link pieces between the ends of adjacent strips at the open end of the crucible, or by making U shaped elements by folding the flat tapes as suggested above. In this case, only one spring mounting, attached to the link, need be provided for each pair of strips.

It is also possible to fabricate a self supporting element which incorporates additional heating at the open end of the crucible from a sheet of foil. The foil is first corrugated by folding it along parallel lines and then cut so that the completed element consists of the required number of individual strips each linked to adjacent strips at opposite ends, i.e. so the path of the element resembles a rectangular wave. Support brackets are fitted to the lower links, and the element is formed into a cylinder which surrounds the crucible. The electrical supply leads are connected to the lower ends of the strips at the outside edges of the sheet of foil, so that the individual strips are connected in series. However, an element formed in this way is more difficult to replace than an element formed from two strips, and additional unwanted heat is radiated by the connecting links at the lower end of the crucible.

BRIEF DESCRIPTION OF THE DRAWINGS

Some examples of the invention will now be described in greater detail with reference to the accompanying drawings, in which:

FIG. 1 is a general sectional view of a source constructed according to the invention;

FIG. 2 is a sectional view taken along the plane A—A in FIG. 1;

FIG. 3 is a view of a folded self supporting element comprising two individual strips suitable for use in the cell shown in FIG. 1;

DETAILED DESCRIPTION OF THE INVENTION

Figure 4:
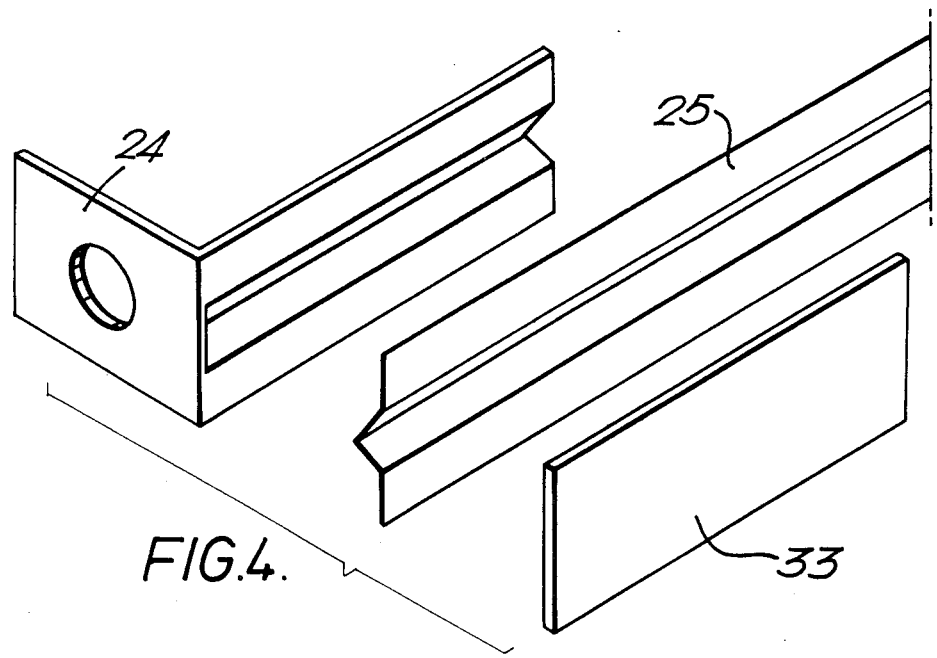
FIG. 4 is a view of a supporting bracket assembly suitable for use with the element shown in FIG. 3.

Referring first to FIG. 1, which has been expanded in the radial direction for the sake of clarity, the crucible 1 is preferably of about 40 ccs capacity and is made from 99.999% pure pyrolytic boron nitride or from spectroscopically pure graphite. It is supported at its open end by tantalum flange 2, and its lower end is a sliding fit in a large counterbore in graphite cylinder 3. At the bottom of this large counterbore is another counterbore which contains a tantalum disc 4, which is in good thermal contact with the bottom of crucible 1. A tungsten-rhenium thermocouple 5 is attached to disc 4 in order to monitor the temperature at the bottom of crucible 1. Cylinder 3 and disc 4 are held in position by means of bush 6 which is secured to thermocouple mounting tube 7. Tube 7 runs through clearance holes in supporting flanges 8 and 9, and is spring loaded by compression spring 10 acting against bush 11 on tube 7. Spring 10 pushes cylinder 3 and crucible 1 towards flange 2, but the rim of crucible 1 is prevented from moving away from flange 2 by means of clips 12, so that spring 10 effectively maintains disc 4 in contact with the base of crucible 1. Tube 7, bush 6, and flanges 8 and 9 are preferably made of molybdenum. The leads of thermocouple 5 (not shown) pass inside tube 7 and are connected to electrical feedthroughs on flange 13 which is used to mount the entire source in the vacuum system. Support flanges 8 and 9 are mounted inside support tube 14, preferably made of tantalum. Three molybdenum rods 15 are screwed into flange 8, pass through flange 9, and are secured in brushing on flange 13, securing the cell to mounting flange 13. Tube 14 carries three circular flanges 16 on its outer surface which support another tantalum tube 17. Flange 2 is attached to the end of tube 17 to support the mouth of the crucible. A spiral coil of stainless steel tubing 18 is wound over tube 17, and this is enclosed by another tube 19. This is spun over at the end to locate tube 19 on tube 17. The ends of the tube forming coil 18 are taken through flange 13 to allow a coolant to be circulated through it. Generally, water is used as a coolant, but in some cases, liquid nitrogen may be preferred.

The inside of tube 14 is lined with a number of cylindrical radiation shields 20 (usually four) which are spaced apart by thin tantalum pads sandwiched between them. The radiation shields are preferably made from tantalum foil and are secured inside tube 14 by a number of tantalum spring clips. More radiation shields in the form of thin tantalum discs 21 are fitted on flange 8. As many as 20 discs may be used.

Each heating element, generally indicated by 22, is mounted on two supporting brackets 24, which are attached to insulated mountings 50 on support tube 14.

Elements 22 are made from tantalum foil, typically 10 mm wide and 0.0125 mm thick. As shown in FIG. 3, they consist of two strips of foil 25 and 26 which are joined at one end by a conductive link 27. This may consist of a separate piece of electrically conductive metal which is firmly attached to the ends of the strips, ensuring a low resistance joint, but preferably it should consist of a piece of the same tantalum foil which is used to make the strips. In this case the link 27 serves to radiate heat just as the remainder of the element, and the heat output from the whole assembly is therefore greater in the region of the link than elesewhere because of the greater surface area of heated element in this region. This feature is used to increase heat output of the element close to the open end of the crucible by positioning the link end of the element close to the open end of the crucible. The temperature of the open end of the crucible can therefore be maintained at or above the temperature at its closed end, in spite of the greater heat losses from the open end. Construction of the element is also facilitated when link 27 is made from tantalum foil because the complete element comprising strips 25 and 26 and link 27 can be made simply by folding a single length of foil along lines 28 and 29 to form the U shaped element shown in FIG. 3. The free ends of strips 25 and 26 are then attached to mounting brackets 24 by clamping or spot welding so that the element can be mounted on insulators fixed to support tube 14 as described.

As previously explained, the foil strip from which the elements are made is very thin, and some additional strengthening of the strips 25 and 26 is required to make the element self supporting. This is most conveniently achieved by folding the strip along its centre line 30 and further folding along lines 31 and 32 in the opposite direction to the first fold. This results in each strip having a corrugated cross section, as shown in FIG. 3, which imparts considerable rigidity to the element. Link section 27 should preferably remain flat, but this is not essential. This method of folding allows the elements to present a large surface area to the surface of the crucible whilst making them essentially self supporting.

In order to maintain the elements in the corrugated form shown in FIG. 3, it is preferable to form at least part of the supporting brackets 24 with the same cross sectional shape as the element corrugation. FIG. 4 shows an exploded view of a bracket assembly where this has been done. The end of each strip of foil 25 is clamped between the shaped bracket 24 and a flat plate 33, and the whole assembly is firmly spot welded together. Bracket 24 and plate 33 are preferably made of molybdenum. The strip 25 may also be spot welded to the bracket 24 on the folded central part to ensure that the element is maintained in its corrugated form. Alternatively, plate 33 could be shaped to fit into the fold of bracket 24.

Figure 5:
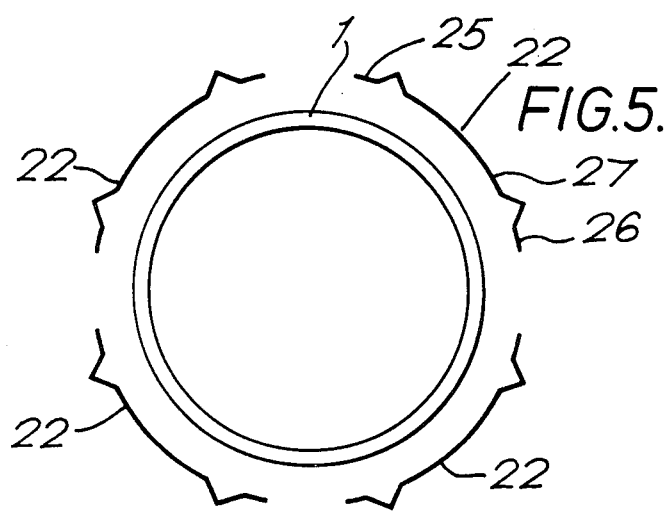
FIG. 5 shows schematically how the elements shown in FIG. 3 may be arranged round the crucible in the complete cell.

In the cell illustrated in FIGS. 1 and 2, four heating elements 22 are symmetrically disposed around crucible 1, as indicated schematically in FIG. 5. The lengths of the strips 25 and 26 should be such as to ensure that the link 27 is positioned as close as possible to flange 2 (FIG. 1), making allowance for the considerable increase of length of the elements when heated. This ensures that the entire length of the crucible is heated.

Although the elements are substantially self supporting, it is advisable to provide some additional restraining means to ensure that the link end of the element, remote from the mounting brackets, cannot accidentally contact the crucible wall or the radiation shields 20. The restraining means may conveniently take the form of a disc or discs of insulating material containing four large circular slots, such as 23 in FIGS. 1 and 2. Each element 22 passes through one of the slots, and the corrugations in the strips ensure that there is only minimal contact between the element and the insulator, even if the element is displaced from its proper position far enough to make contact with the insulator. Insulators 23 are preferably made from pyrolytic boron nitride, and are secured by dimples (not shown) raised in the inner sheet of the radiation shields 20. The electrical supply leads 51 for the heating elements are attached to brackets 24.

When the elements are fitted to the cell, the position of the brackets 24 is adjusted so that the link section 27 is curved slightly, and the entire element passes through the slot in insulator 23 without contacting the sides of the slot, as shown in FIG. 2.

Figure 9:
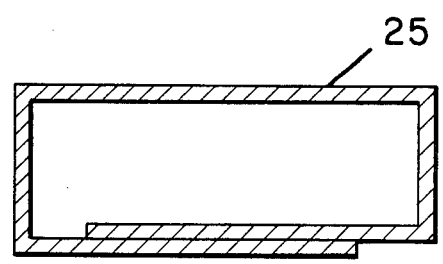
FIG. 9 is a cross sectional view through a strip in a folded self-supporting element suitable for use in the cell shown in FIG. 1.

As previously explained, other methods of imparting rigidity to the elements other than the method of folding shown in FIG. 3 may be used. In some cases, a single fold, resulting in a V shaped strip, may be sufficient, or the strip may be folded, e.g., as shown in FIG. 9 to form a closed circular, elliptical or rectangular cross section, with the edges joined together by spot welding. However, elements formed in this way, which are essentially thin walled tubes, are not as efficient as a folded strip because a smaller proportion of the surface area of the element directly radiates the crucible.

It will be appreciated from the foregoing description that each heating element preferably comprises two strips and is supported only at two points, namely the supporting brackets 24 on each strip. The replacement of a failed element is therefore straightforward, and can be done simply by removing the outer shielding of the cell. In addition, it will be seen from FIG. 1 that the crucible 1 can be removed for repalcement or cleaning simply by releasing the spring clips 12 on flange 2, without any further dismantling. This is a very important advantage of the present invention in comparison with prior art Knusden cells in which the heating wire is often wound on the crucible itself.

Figure 6:
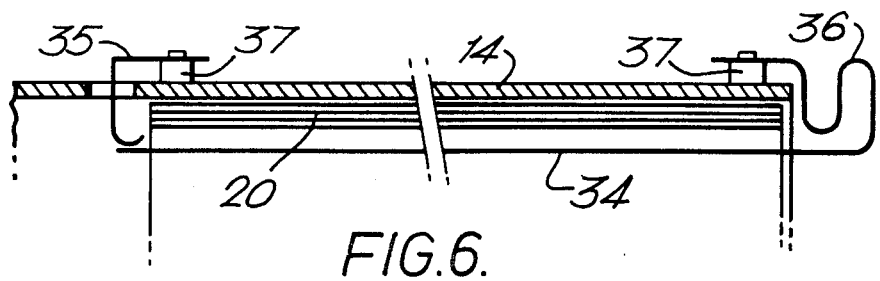
FIG. 6 shows how individual strip elements could be mounted on springs.

FIG. 6 shows a method in which elements consisting of a single length of flat foil are mounted on springs according to the alternative embodiment of the invention. Each heating element 34, which consists of a flat strip of tantalum, typically 10 mm wide by 0.0125 mm thick, is spot welded to bracket 35 and spring 36, each preferably made from molybdenum, which are attached to tube 14 by insulators 37. The tension in element 34 produced by spring 36 is adjusted to compensate for the expansion of element 34 as it is heated. Spring 36 and bracket 35 should possess as low a thermal conductivity as possible. Typically, ten such elements can be fitted inside tube 14, symmetrically disposed about crucible 1. Insulators 23 can be omitted. If desired, the elements can be fabricated in the manner illustrated in FIG. 3, without the corrugations, and only one spring 36 used to support a pair of strips. This technique can be used to produce more heat in the region of the crucible mouth, as discussed. Alternatively, a similar effect can be achieved by spot welding links between the ends of the elements. As in the previous embodiment, it is a simple matter to replace either a failed heating element or the crucible.

Figure 7:
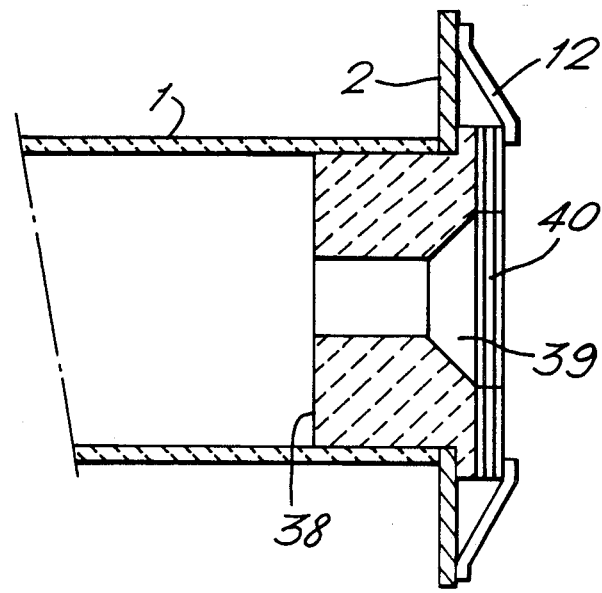
FIG. 7 shows how the mouth of the crucible can be restricted to produce true Knusden evaporation.

If it is desired to restrict the mouth of the crucible in order to ensure true Knusden evaporation, then the method of construction illustrated in FIG. 7 can be used. A substantially pure graphite plug 38 with a smaller orifice 39, selected to ensure true Knusden evaporation, is fitted in the mouth of crucible 1 and maintained in position in the hole in flange 2 by springs 12. The heat losses from the end of plug 38 are reduced by several tantalum heat shields 40 which are spaced apart by tantalum pads. Use of these shields, and elements constructed according to FIG. 3, ensures that the temperature of the graphite plug can be maintained close to that of the crucible, minimizing the problems encountered with conventional Knusden cell sources operated at high temperature.

Figure 8:
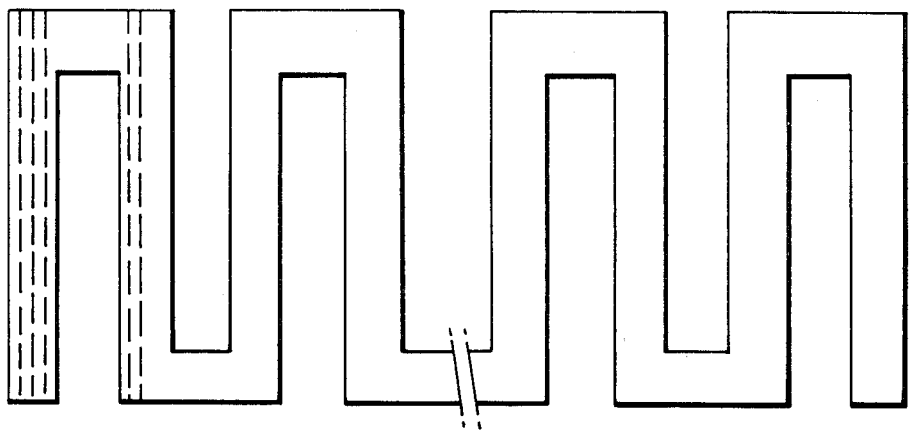
FIG. 8 shows how a complete element suitable for use in the invention can be fabricated from a single piece of material.

FIG. 8 illustrates the fabrication from a sheet of foil of a self supporting element which incorporates additional heating at the open end of the crucible. The foil is first corrugated by folding it along the dotted lines (some of which are shown in FIG. 8) and then cut into the shape shown in the figure so that the completed element consists of the required number of individual strips each linked to adjacent strips at opposite ends. Support brackets are fitted to the lower links, and the element is formed into a cylinder which surrounds the crucible. The electrical supply leads are connected to the lower ends of the strips at the outside edges of the sheet of foil, so that the individual strips are connected in series.

What is claimed is:

1. A molecular or atomic beam source for molecular beam epitaxy comprising a hollow crucible having an open end and a closed end, at least one substantially self-supporting heating element heating said crucible disposed outside of and spaced apart from said crucible, and electrical supply leads to enable electrical current to be passed through each heating element, each heating element being supported by means of insulated electrically conductive supporting means only at the closed end of said crucible, each heating element comprising at least one pair of thin elongate metal strips extending substantially parallel to the axis of said crucible and disposed to present a major surface to the wall of said crucible, the strips of each pair being connected at the open end of said crucible by an electrically conductive link, and each of said strips being folded along one or more lines parallel to its longest edge in order to increase its resistance to bending.

2. A molecular or atomic beam source according to claim 1 in which said conductive link is capable of emitting heat, whereby the heat input to said open end of said crucible is increased.

3. A molecular or atomic beam source according to claim 1 in which said strips are of a refractor metal.

4. A molecular or atomic beam source according to claim 3 in which said strips are of tantalum.

5. A molecular or atomic beam source according to claim 2 in which the strips and conductive links comprising each said element are integrally formed from a refractory metal.

6. A molecular or atomic beam source according to claim 5 in which said refractory metal is tantalum.

7. A molecular or atomic beam source according to claim 1 in which each said thin elongate metal strip has a width much greater than its thickness and is folded along one line substantially parallel to its longest edge.

8. A molecular or atomic beam source according to claim 1 in which each said thin elongate metal strip has a width much greater than its thickness and is folded along two or more lines substantially parallel to its longest edge, and in which adjacent folds are made in opposite directions to produce a corrugated strip of overall width greater than its overall thickness.

9. A molecular or atomic beam source according to claim 1 in which each said thin elongate metal strip has a width much greater than its thickness and is folded along two or more lines substantially parallel to its longest edge, and in which adjacent folds are made in the same direction to produce a strip of substantially tubular form.

10. A molecular or atomic beam source according to claim 1 in which said crucible is provided at its open end with a narrow orifice whereby Knusden evaporation may be produced.

11. A molecular or atomic beam source according to claim 1 in which one heating element is provided, the said element comprising a plurality of strips spaced apart substantially equally, disposed substantially symmetrically around said crucible, and linked at opposite ends to adjacent strips by conductive links, said element and said conductive links being fabricated from a single sheet of refractory metal and mounted on supporting brackets attached to said element only at the closed end of said crucible, and said element being corrugated by folding along lines parallel to the longest axes of said strips.

12. A molecular or atomic beam source according to claim 1 in which at least a part of said supporting means is fabricated with a cross section and shape complementary to that of said strip supported therefrom.

* * * * *